(12) United States Patent
Sasaki

(10) Patent No.: US 10,104,804 B2
(45) Date of Patent: Oct. 16, 2018

(54) ELECTRONIC DEVICE

(71) Applicant: FANUC CORPORATION, Yamanashi (JP)

(72) Inventor: Kazuyuki Sasaki, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/598,311

(22) Filed: May 18, 2017

(65) Prior Publication Data
US 2017/0339801 A1 Nov. 23, 2017

(30) Foreign Application Priority Data
May 19, 2016 (JP) .................... 2016-100564

(51) Int. Cl.
H05K 7/20 (2006.01)
H05K 5/02 (2006.01)

(52) U.S. Cl.
CPC ............. H05K 7/20 (2013.01); H05K 5/0217 (2013.01)

(58) Field of Classification Search
CPC ................. H05K 7/20; H05K 5/0217
USPC ............................................. 361/692
See application file for complete search history.

(56) References Cited

U.S. PATENT DOCUMENTS

| | | | | |
|---|---|---|---|---|
| 4,898,009 A * | 2/1990 | Lakoski | ............ | E05B 73/00 439/133 |
| 5,297,000 A * | 3/1994 | Freige | ............ | G06F 1/183 361/692 |
| 5,806,940 A * | 9/1998 | Heirich | ............ | G06F 1/1601 312/263 |
| 7,388,745 B2 * | 6/2008 | DeLuga | ............ | G06F 1/1632 361/690 |
| 7,529,087 B2 * | 5/2009 | Dubrule | ............ | G06F 1/20 361/679.5 |
| 7,778,013 B2 * | 8/2010 | Bruski | ............ | H05K 5/0213 361/605 |
| 8,699,226 B2 * | 4/2014 | Tanner | ............ | F28F 1/40 361/679.47 |
| 9,280,187 B2 * | 3/2016 | Donner | ............ | F25D 21/14 |
| 9,549,475 B2 * | 1/2017 | Honda | ............ | H05K 5/069 |
| 9,781,849 B2 * | 10/2017 | Negishi | ............ | H05K 5/0056 |
| 2004/0172986 A1 * | 9/2004 | Heo | ............ | D06F 37/42 68/19 |
| 2006/0089096 A1 * | 4/2006 | Wolm | ............ | B41J 29/377 454/184 |
| 2007/0134981 A1 * | 6/2007 | Shinoda | ............ | H05K 5/0047 439/587 |

(Continued)

FOREIGN PATENT DOCUMENTS

JP 9-307247 A 11/1997

Primary Examiner — Anatoly Vortman
(74) Attorney, Agent, or Firm — Hauptman Ham, LLP

(57) ABSTRACT

Elongated top panel heat dissipation slits each include a first long side sidewall that extends in a depth direction of a first long side, and a second long side sidewall that extends in the depth direction of a second long side. For example, the second long side sidewall is provided with projection portions that protrude toward the first long side sidewall. Then, step portions are formed. The step portions incline to a lower side as the step portions extend away from printed circuit boards. An inclined rib inclining to a lower side in an extension direction of a casing locates near lower end portions of the step portions.

10 Claims, 16 Drawing Sheets

(56) References Cited

U.S. PATENT DOCUMENTS

2015/0016053 A1\* 1/2015 Donner .................. F25D 21/14
361/679.46
2015/0208525 A1\* 7/2015 Negishi ................ H05K 5/0056
361/752

\* cited by examiner

ELECTRONIC DEVICE

CROSS-REFERENCE TO RELATED APPLICATION

This application is based upon and claims the benefit of priority from Japanese Patent Application No. 2016-100564 filed on May 19, 2016, the contents of which are incorporated herein by reference.

BACKGROUND OF THE INVENTION

Field of the Invention

The present invention relates to an electronic device in which substrates provided with electronic parts are housed in a casing.

Description of the Related Art

An electronic device is assembled in, for example, a control panel of a machine tool, and is used as a numerical control device. An electronic device of this type is formed by housing printed circuit boards provided with electronic parts such as capacitors, transistors or electromagnetic coils in a casing. Further, power is supplied to the electronic parts during use, and the electronic parts heat up in response to the supplied power. Heat dissipation slits are provided on a bottom plate, side plates, a top panel and the like of the casing to release this heat.

The machine tool includes a processing tool that performs predetermined processing on a workpiece. More specifically, the machine tool is a drill that performs drilling processing on a workpiece. In this case, a cutting fluid is supplied to a drilling processing portion of the device. The drilling processing portion is usually covered with a cover to prevent the cutting fluid from scattering. However, when sealing capability of the cover decreases due to aging, a mist of the cutting fluid, i.e., cutting fluid mist is likely to scatter outside the cover and enter the control panel. A situation is also assumed, in which cutting fluid mist forms droplets that drop from other parts positioned above this electronic device.

When such a situation takes place, the mists adhere to the casing of the electronic device and enter the casing from the heat dissipation slits of the top panel. Particularly when another electronic device with a fan is located above the electronic device, mist is collected by the fan and are dissipated by the airflow which cause the mist to more easily reach the casing.

The mist can cause short-circuiting or deterioration of the electronic parts. Therefore, it is preferable to quickly discharge mist which has entered the casing to the outside. Japanese Laid-Open Patent Publication No. 09-307247 (hereinafter, referred to as JP09-307247A) proposes a configuration including a rib in a television receiver or the like that extends from peripheral portions of slit holes of a top panel into a casing and inclines to a lower side at a closer side to a drain hole formed in a rear plate of a longitudinal wall.

SUMMARY OF THE INVENTION

According to a conventional technique disclosed in JP09-307247A, a rib is extended from a periphery of each slit and an outlet is formed per rib which is inclined to a lower side, which results in a complicated mold for forming a casing. Further, in this case, it is necessary to avoid interference of printed circuit boards with the ribs protruding toward an interior of the casing, which results in a reduction of effective volume in the casing. Furthermore, it is necessary to provide multiple ribs, which results in increased material being used and increased weight.

A main object of the present invention is to provide an electronic device that can easily discharge droplets entering the device's casing.

Another object of the present invention is to provide the electronic device that has a large effective volume in the casing.

Still another object of the present invention is to provide the electronic device with reduced casing material.

Yet still another object of the present invention is to provide the electronic device with reduced casing weight.

One aspect of the present invention provides an electronic device that is formed by housing one or more substrates in a casing, wherein the one or more substrates are provided with an electronic part, and the casing includes a plurality of heat dissipation slits formed in a top panel, and in which: the heat dissipation slits each have an elongated shape including a first short side and a second short side that extend in substantially parallel to an extension direction of the substrates, and a first long side and a second long side that extend in a direction substantially orthogonal to the extension direction and face each other, and include a first short sidewall, a second short sidewall, a first long sidewall and a second long sidewall that extend along a depth direction of the first short side, the second short side, the first long side and the second long side; a projection portion is formed on at least one of the first long sidewall and the second long sidewall that face each other, and protrudes toward another of the first long sidewall and the second long sidewall, and the projection portion forms a step portion with the one of the first long sidewall and the second long sidewall; the step portion inclines from an upper side to a lower side as the step portion extends away from the substrates; an inclined rib is formed in the casing to locate near a lower end portion of the step and extend along the extension direction of the substrates so as to cross all of the heat dissipation slits; the inclined rib inclines from the upper side to the lower side in the extension direction; and a drain hole configured to discharge a droplet guided by the inclined rib is formed in a wall surface of the casing.

Another aspect of the present invention provides an electronic device that is formed by housing one or more substrates in a casing, wherein the one or more substrates are provided with an electronic part, and the casing includes a plurality of heat dissipation slits formed in a top panel, and in which: the heat dissipation slits each have an elongated shape including a first short side and a second short side that extend in substantially parallel to an extension direction of the substrates, and a first long side and a second long side that extend in a direction substantially orthogonal to the extension direction and face each other, and include a first short sidewall, a second short sidewall, a first long sidewall and a second long sidewall that extend along a depth direction of the first short side, the second short side, the first long side and the second long side; a lower end of at least one of the first long sidewall and the second long sidewall protrudes in a depth direction of the heat dissipation slits to form a lower protrusion portion; the lower protrusion portion inclines from an upper side to a lower side as the lower protrusion portion extends away from the substrates; an inclined rib is formed in the casing to locate near a lower end portion of the lower protrusion portion and extend along the extension direction of the substrates so as to cross all of the heat dissipation slits; the inclined rib inclines from the upper side to the lower side toward the extension direction; and a drain hole configured to discharge a droplet guided by the inclined rib is formed in a wall surface of the casing.

Thus, according to the present invention, the step portion or the lower protrusion portion is formed on at least one of the two long sidewalls of the heat dissipation slits formed in the top panel. Further, this step portion or the lower protrusion portion inclines to the lower side as it extends away from the substrates housed in the casing. Hence, when a droplet enters the heat dissipation slit, the droplet is guided by the step portion or the lower protrusion portion and moves to the lower side (the depth direction of the heat dissipation slits).

The lower end portion of the step portion or the lower protrusion portion is provided with the inclined rib. This inclined rib inclines to the lower side in the extension direction (e.g., depth direction) of the casing. Hence, the droplet moving from the step portion or the lower protrusion portion onto the inclined rib is guided by the inclined rib and moves in the extension direction of the casing. The droplet is guided outside the casing via a drain hole formed in a wall surface of the casing.

Thus, the step portion or the lower protrusion portion, and the inclined rib form a guide path that guides the droplet to the drain hole. That is, by forming the inclined rib and the step portion or the lower protrusion portion, the droplet having entered the heat dissipation slit of the top panel is quickly discharged outside the casing. Consequently, it is possible to avoid short-circuiting or acceleration of deterioration of the electronic parts in the casing due to the droplet.

Further, the step portion or the lower protrusion portion inclines to the lower side as it extends away from the substrates. Consequently, it is possible to avoid an interference of the step portion or the lower protrusion portion with the substrates. Consequently, it is possible to increase an effective volume in the casing.

In addition, according to the present invention, it is only necessary to form the step portion or the lower protrusion portion, and the inclined rib. Consequently, it is possible to avoid an excessive increase in the amount of material (e.g., resin material) forming the casing, and an increase in the weight of the casing. Further, the shape of the mold for molding the casing does not become complicated.

The drain hole only needs to be formed at, for example, a position of the casing facing a lower end portion of the inclined rib. The drain hole is typically formed in an opposite surface to a surface provided with a terminal, i.e., in a rear surface.

Alternatively, the drain hole may be formed in a bottom plate of the casing. In this case, a longitudinal rib bent from the inclined rib to a lower side only needs to be formed in the casing. By this means, a droplet moves from the inclined rib onto the longitudinal rib, is guided by the longitudinal rib, and moves toward the bottom plate. Consequently, it is possible to lead the droplet outside the casing via the drain hole formed in the bottom plate.

Further, preferably, the top panel of the casing inclines to a lower side as the top panel approaches the step portion or the lower protrusion portion. According to this configuration, when the droplet adheres to the top panel, the droplet is guided by the top panel and enters the heat dissipation slits. Consequently, it is possible to quickly guide to the drain hole the droplet adhered to the top panel as well, and lead the droplet outside the casing.

The lower protrusion portion may be provided with the step portion. More specifically, a long side projection portion is formed on the lower protrusion portion, and protrudes toward the first long sidewall or the second long sidewall facing the lower protrusion portion. Then, the long side projection portion forms a long side step portion with the long side sidewall. The long side projection portion inclines from an upper side to a lower side as the long side projection portion extends away from the substrates.

According to this configuration, the long side step portion also guides droplets. Consequently, the droplets more easily move. Consequently, it is easier to lead the droplets outside the casing via the drain hole.

A short side step portion continuing to a long side step portion may be further formed. More specifically, a short side projection portion is formed on at least one of the two short sidewalls of the heat dissipation slits, and protrudes toward another short sidewall. The two short sidewalls face each other. Then, the short side projection portion forms the short side step portion with the short side sidewall. The short side step portion inclines from an upper side to a lower side as the short side step portion approaches an upper end portion of the long side step portion. A lower end portion of the short side step portion continues to the upper end portion of the long side step portion.

According to this configuration, when a droplet adheres to a proximity of the short side of the heat dissipation slit, the droplet is guided by the short side step portion and reaches the upper end portion of the long side step portion. After moving onto the long side step portion, the droplet is guided by the long side step portion or the lower protrusion portion and moves onto the inclined rib. Eventually, in this case, it is easy to guide the droplet adhered to the proximity of the short side to the drain hole, and consequently it is possible to prevent the droplet from reaching the substrates in the casing.

According to the present invention, in the heat dissipation slits formed in the top panel of the casing, the step portion or the lower protrusion portion is formed inclining to the lower side in the depth direction of the heat dissipation slits, and the inclined rib is formed near the lower end portion of the step portion or the lower protrusion portion. The step portion or the lower protrusion portion, and the inclined rib function as guide paths for droplets, and lead the droplets to the drain hole. Consequently, it is possible to prevent the droplets from reaching the substrates (electronic parts) in the casing. Consequently, it is possible to avoid short-circuiting and acceleration of deterioration of the electronic parts due to droplets.

Further, the step portion or the lower protrusion portion inclines to the lower side as it extends away from the substrates. Consequently, it is possible to avoid an interference of the step portion or the lower protrusion portion with the substrates. Consequently, it is possible to increase the effective volume in the casing.

Further, the step portion or the lower protrusion portion, and the inclined rib are formed only. Consequently, it is possible to avoid an excessive increase of material (e.g., a resin material) for forming the casing. Furthermore, it is possible to avoid an increase in the weight of the casing. Still further, the shape of the mold for molding the casing does not become complicated.

For the above-described reasons, it is possible to provide the electronic device that can easily discharge droplets entering the casing at low cost while reducing the weight.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
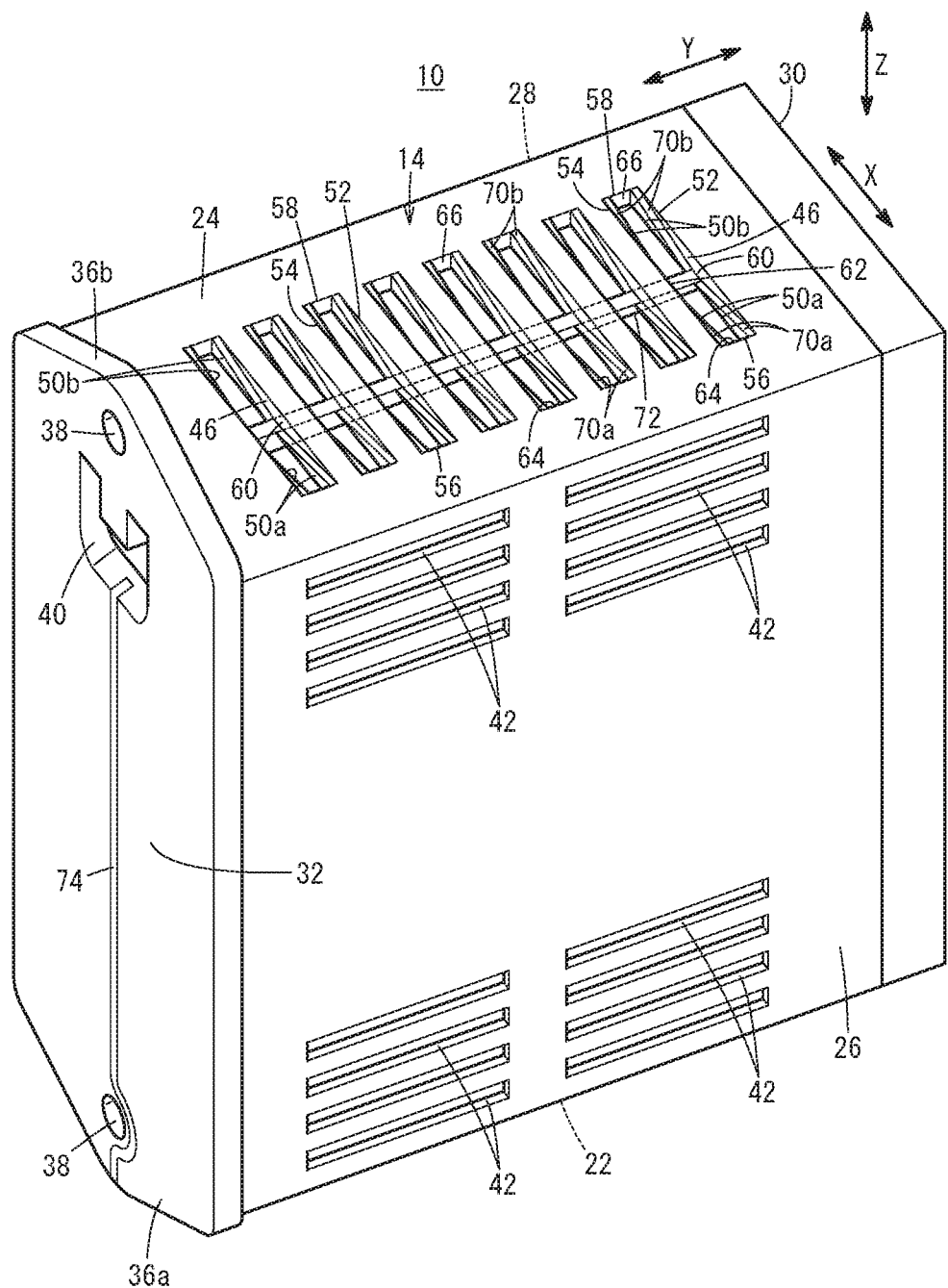
FIG. 1 is an overall schematic perspective view of an electronic device according to a first example of the present invention.

Preferred embodiments of an electronic device according to the present invention will be described in detail with reference to the accompanying drawings. A width direction, a depth direction and a height direction described below correspond to an X direction, a Y direction and a Z direction of arrows in the drawings.

Figure 2:
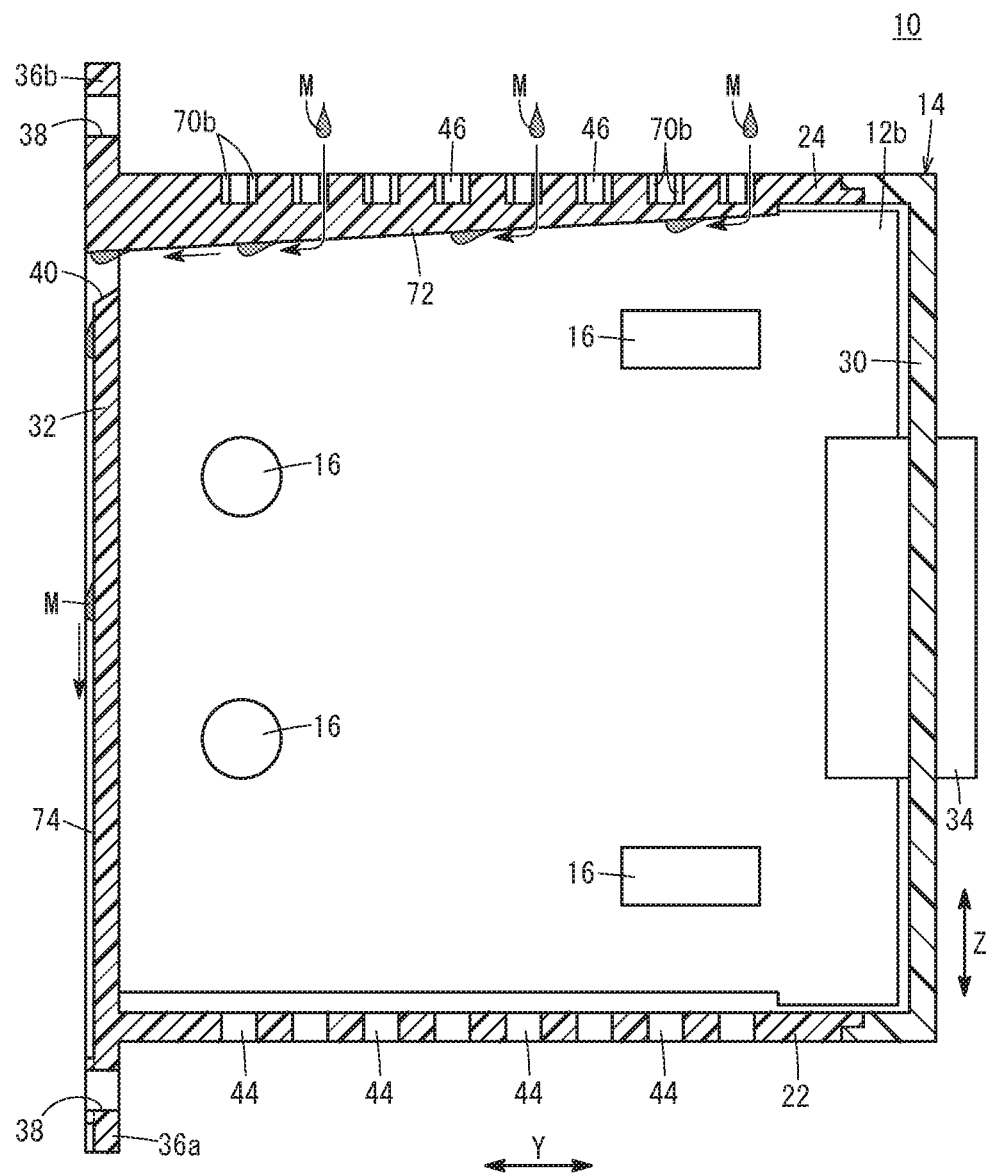
FIG. 2 is a side longitudinal cross-sectional view of the electronic device according to the first example in which two substrates are housed in a casing.
Figure 3:
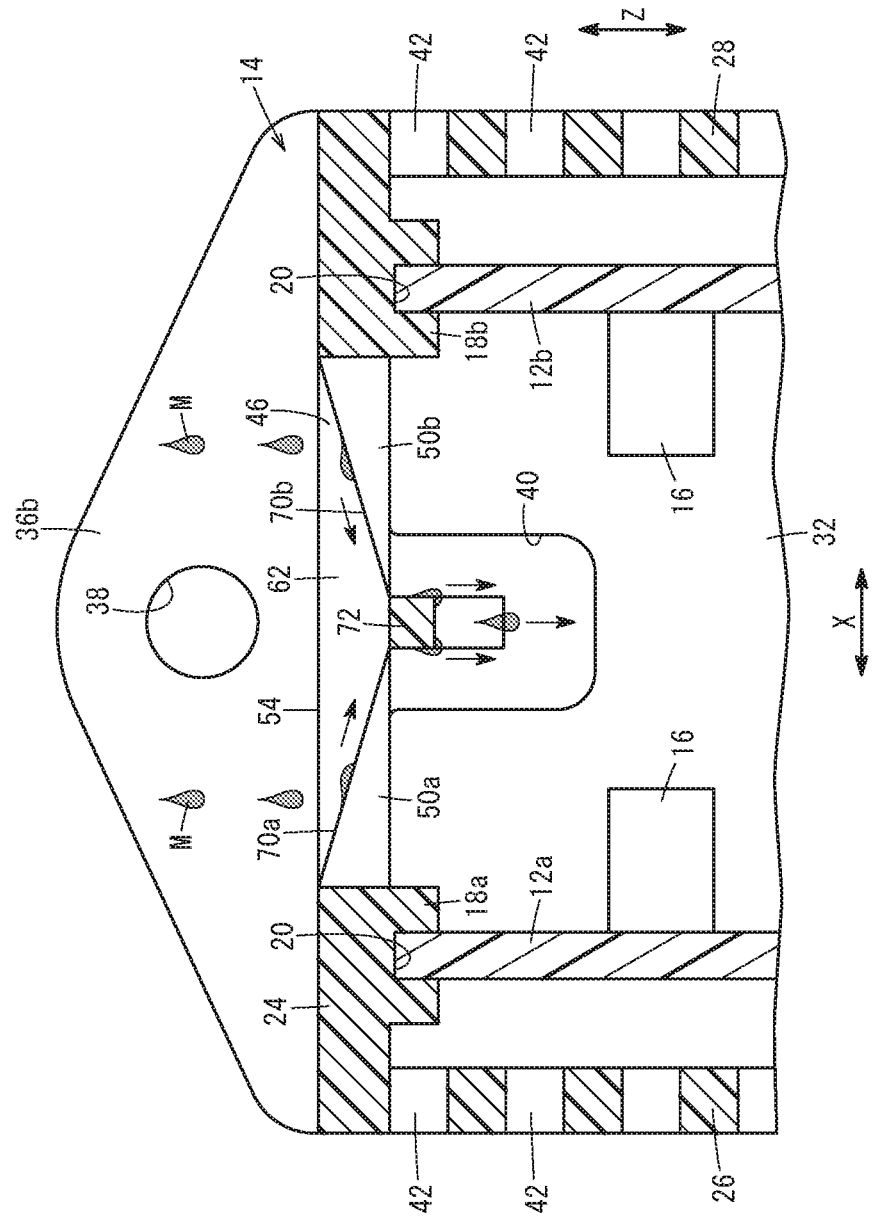
FIG. 3 shows a main part of a front longitudinal cross section of the electronic device shown in FIG. 2.
Figure 4:
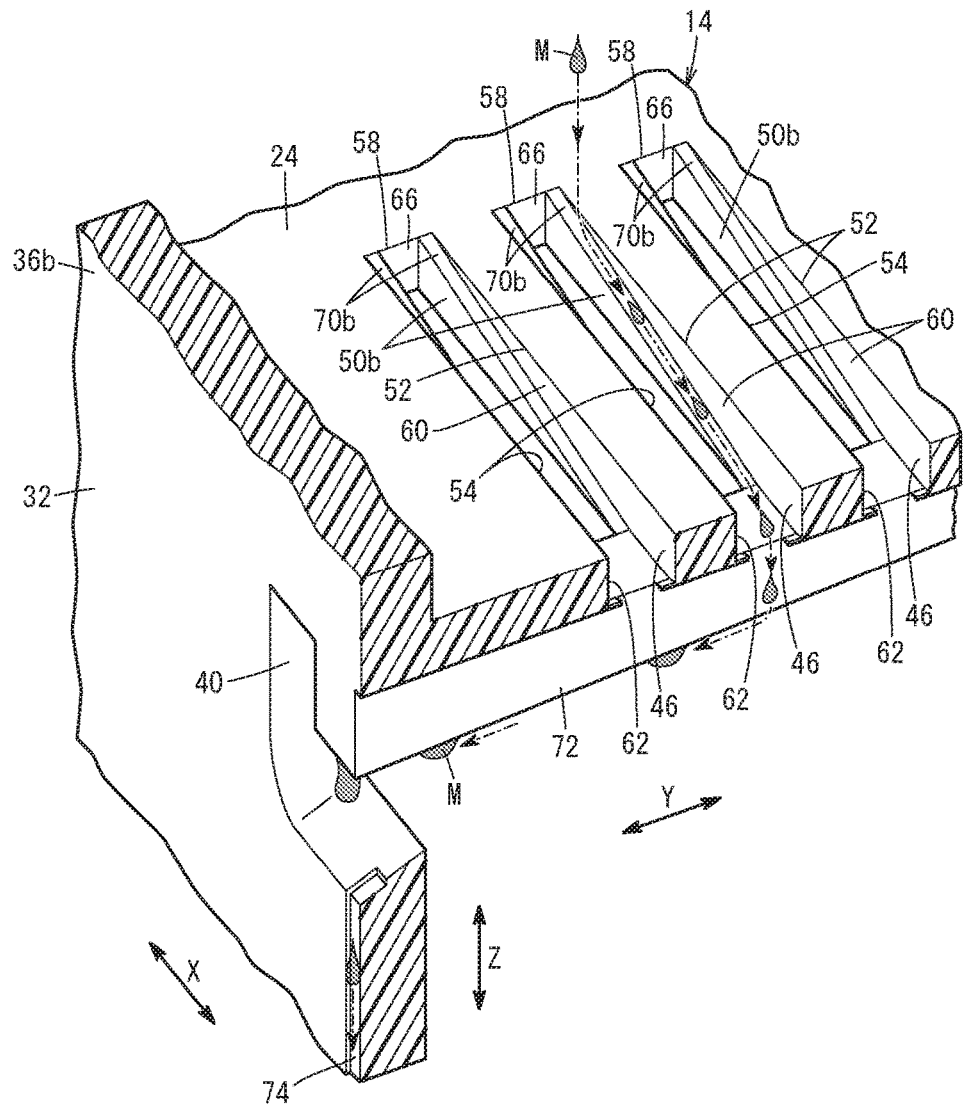
FIG. 4 is a cross-sectional perspective view showing a main part of a proximity of top panel heat dissipation slits of the electronic device shown in FIGS. 1 to 3.

FIGS. 1 to 3 are an entire schematic perspective view, a side longitudinal cross-sectional view and a main part of a front longitudinal cross section of an electronic device 10 according to a first embodiment. FIG. 4 is a cross-sectional perspective view showing a main part of a proximity of top panel heat dissipation slits 46 formed on a casing 14 that composes the electronic device 10. This electronic device 10 is formed by housing in the casing 14 two printed circuit boards 12a, 12b (see FIGS. 2 and 3). This casing 14 is made of a resin material.

The printed circuit boards 12a, 12b are substrates on which conduction paths that are not shown are printed. Various electronic parts 16 such as a capacitor, a resistor, an electromagnetic coil, a transistor and diodes are attached to predetermined positions of the conduction paths. As shown in FIG. 3, the printed circuit boards 12a, 12b formed in this way are housed in the casing 14 such that surfaces (primary surfaces) provided with the electronic parts 16 face each other.

Lower support portions 17a, 17b (see FIG. 15) and upper support portions 18a, 18b are provided in the casing 14. Insertion grooves 20 are formed on these lower support portions 17a, 17b and upper support portions 18a, 18b. When lower rim portions and upper rim portions of the printed circuit boards 12a, 12b are inserted in the insertion grooves 20, the printed circuit boards 12a, 12b are supported by the casing 14, and are positioned and fixed.

The insertion grooves 20 extend along the depth direction of the casing 14. Hence, an extension direction of the printed circuit boards 12a, 12b is the depth direction of the casing 14.

As shown in FIG. 1, the casing 14 has a substantially cuboid shape, and is a so-called upright type that has a larger height than a width. Further, the depth is slightly larger than the height. Hereinafter, two wall portions that extend along the depth direction and the width direction will be referred to as a bottom plate portion 22 (bottom plate) and a top panel portion 24 (top panel). Two wall portions that extend along the depth direction and the height direction will be referred to as a first side plate portion 26 and a second side plate portion 28. Wall portions that extend along the width direction and the height direction will be referred to as a terminal surface plate 30 and a rear plate 32.

The terminal surface plate 30 is provided with a terminal 34 (see FIG. 2) that supplies power to each of the electronic parts 16. The rear plate 32 is provided with base portions 36a, 36b that protrude along the height direction. Bolt insertion holes 38 are formed in the base portions 36a, 36b, and bolts (not shown) that connect the casing 14 to a control panel (not shown) are inserted in the bolt insertion holes 38.

A drain hole 40 (see FIG. 2) that penetrates from an inner surface to an outer surface is formed in the rear plate 32. This will be described below.

A plurality of heat dissipation slits (see FIG. 1) whose openings are formed in rectangular shapes when seen from a plan view are formed in each of the first side plate portion 26, the second side plate portion 28, the bottom plate portion 22 and the top panel portion 24. That is, each heat dissipation slit has an elongated shape. Hereinafter, for ease of distinction, the heat dissipation slits of the first side plate portion 26 and the second side plate portion 28 will be referred to as side surface heat dissipation slits 42. The heat dissipation slits of the bottom plate portion 22 will be referred to as bottom surface heat dissipation slits 44. The heat dissipation slits of the top panel portion 24 will be referred to as the top panel heat dissipation slits 46.

The side surface heat dissipation slits 42 in the first side plate portion 26 extend in parallel to the depth direction such that the two side surface heat dissipation slits 42 are adjacent at the same height. A plurality of (e.g., four) heat dissipation slits are aligned in parallel along the height direction at portions near the bottom plate portion 22 and the top panel portion 24. The plurality of side surface heat dissipation slits 42 are formed likewise in the second side plate portion 28, too.

The bottom surface heat dissipation slits 44 and the top panel heat dissipation slits 46 extend along the width direction. Hence, the bottom surface heat dissipation slits 44 and the top panel heat dissipation slits 46 are substantially orthogonal to the depth direction that is the extension direction of the printed circuit boards 12a, 12b.

All wall surfaces of the bottom surface heat dissipation slits 44 and the side surface heat dissipation slits 42 that extend from an outer surface to an interior of the casing 14 along the depth direction are flat. By contrast with this, two projection portions 50a, 50b are formed on the wall surface of the top panel heat dissipation slits 46 as shown in FIGS. 3 and 4.

More specifically, an opening at an outer surface side of each top panel heat dissipation slit 46 has a rectangular shape that includes a first long side 52 (first long side) at the terminal surface plate 30 side, a second long side 54 (second long side) at the rear plate 32 side, a first short side 56 (first short side) at the first side plate portion 26 side, and a second short side 58 (second short side) at the second side plate portion 28 side. From these first long side 52, second long side 54, first short side 56 and second short side 58, a first long side sidewall 60 (first long sidewall), a second long side sidewall 62 (second long sidewall), a first short side sidewall 64 (first short sidewall) and a second short side sidewall 66 (second short sidewall) extend from the opening along the depth direction. The projection portions 50a, 50b are formed on, for example, both of the first long side sidewall 60 and the second long side sidewall 62. The projection portions 50a, 50b may be formed only on the first long side sidewall 60 or may be formed only on the second long side sidewall 62.

The projection portions 50a, 50b formed on the first long side sidewall 60 protrude toward the second long side sidewall 62 facing the first long side sidewall 60. The projection portions 50a, 50b formed on the second long side sidewall 62 protrude toward the first long side sidewall 60 facing the second long side sidewall 62. The first long side 52 and the second long side 54 extend along the width direction of the casing 14. Therefore, a protrusion direction of the projection portions 50a, 50b is the depth direction of the casing 14.

Protrusion thicknesses of the projection portions 50a, 50b are equal. Therefore, the first long side sidewall 60, the second long side sidewall 62 and the projection portions 50a, 50b form step portions 70a, 70b of fixed widths, respectively. The step portion 70a inclines from an upper side to a lower side as the step portion 70a extends away from the first short side 56 and the printed circuit board 12a. The step portion 70b inclines from the upper side to the lower side as the step portion 70b extends away from the second short side 58 and the printed circuit board 12b. Hence, lower end portions of the step portions 70a, 70b face each at a predetermined distance from each other.

As shown in FIG. 2, an inclined rib 72 is formed in the casing 14. The inclined rib 72 extends along the depth direction that is the extension direction of the printed circuit boards 12a, 12b such that the inclined rib 72 locates near lower end portions of the step portions 70a, 70b of each top panel heat dissipation slit 46. That is, the inclined rib 72 crosses substantially intermediate portions of the first long sides 52 and the second long sides 54 of all top panel heat dissipation slits 46. The inclined rib 72 continues to the lower end portions of the step portions 70a, 70b.

The inclined rib 72 inclines from the upper side to the lower side in the depth direction. Therefore, an end portion of the inclined rib 72 facing the terminal surface plate 30 side is an upper end portion positioned at an uppermost side, and an end portion of the inclined rib 72 facing the rear plate 32 side is a lower end portion positioned at a lowermost side. The drain hole 40 of the rear plate 32 of the casing 14 is formed at a position facing the lower end portion of the inclined rib 72. A bottom wall of the drain hole 40 inclines to the lower side, from an interior side to an exterior side of the casing 14.

The electronic device 10 according to the first example is basically configured as described above. Next, a function and an effect of the electronic device 10 will be described.

The electronic device 10 is assembled in, for example, the control panel of the machine tool and is used as a numerical control device. Power is supplied to the electronic parts 16 during use, and the electronic parts 16 heat up in response to the supplied power. This heat is dissipated from the bottom surface heat dissipation slits 44, the side surface heat dissipation slits 42 and the top panel heat dissipation slits 46. Consequently, it is possible to avoid an excessive rise in temperatures of the printed circuit boards 12a, 12b.

When, for example, drilling processing is performed by using a drill, a cutting fluid is supplied to a drilling processing portion. As described above, in this case, the cutting fluid mist M (droplets) enters the control panel, further adheres to the top panel portion 24 of the casing 14 of the electronic device 10 and reaches the top panel heat dissipation slits 46.

As described above, the inclined step portions 70a, 70b are formed on the first long side sidewall 60 and the second long side sidewall 62 in each top panel heat dissipation slit 46. Hence, the mists M go lower while being guided by the step portions 70a, 70b, and move to the intermediate portions of the first long side 52 and the second long side 54. Each drawing shows the multiple mists M for ease of understanding of a movement direction of the mists M. However, even when the mists M enter the casing 14, the amount of the mists M is very little.

The inclined rib 72 locates near the lower end portions of the step portions 70a, 70b. Hence, the mists M move from the step portions 70a, 70b onto the inclined rib 72, and go around to a lower end surface of the inclined rib 72 under a gravitational action. The inclined rib 72 inclines to the lower side at a closer side to the rear plate 32, and therefore the mists M move toward the rear plate 32 side along a lower end surface of the inclined rib 72. The drain hole 40 is formed at a position of the rear plate 32 facing the inclined rib 72 as described above. Hence, the mists M moving along the inclined rib 72 are led outside the casing 14 via the drain hole 40. The bottom wall of the drain hole 40 inclines to the lower side from the interior side to the exterior side of the casing 14. Consequently, it is easy to lead the mists M outside the casing 14. A guide groove 74 that functions as a guide path of the mists M led from the drain hole 40 may be formed in the rear plate 32.

Thus, the step portions 70a, 70b and the inclined ribs 72 function as guide paths that lead to the drain hole 40 the mists M having entered the top panel heat dissipation slits 46, and consequently prevent the mists M from reaching the printed circuit boards 12a, 12b. In other words, it is possible to prevent the electronic parts 16 from wetting due to the mists M. Hence, it is possible to eliminate concerns of, e.g., short-circuiting of the electronic parts 16 and acceleration of deterioration.

In the first embodiment, the step portions 70a, 70b (protrusion portions 50a, 50b) and one inclined rib 72 only need to be formed, and one drain hole 40 also only needs to be formed. Hence, it is possible to avoid an excessive increase of a resin material used to make the casing 14, and an increase in the weight of the casing 14. In addition, a shape of a mold for molding the casing 14 does not become complicated.

The step portions 70a, 70b incline to the lower side at the farther side from the printed circuit boards 12a, 12b. Consequently, the step portions 70a, 70b hardly interfere with the printed circuit boards 12a, 12b, so that it is possible to increase an effective volume in the casing 14.

As described above, according to the first example, it is possible to obtain the electronic device 10 of a large effective volume in the casing 14 and reduce the resin material used to form the casing 14. Further, it is possible to reduce the weight of the casing 14.

Figure 5:
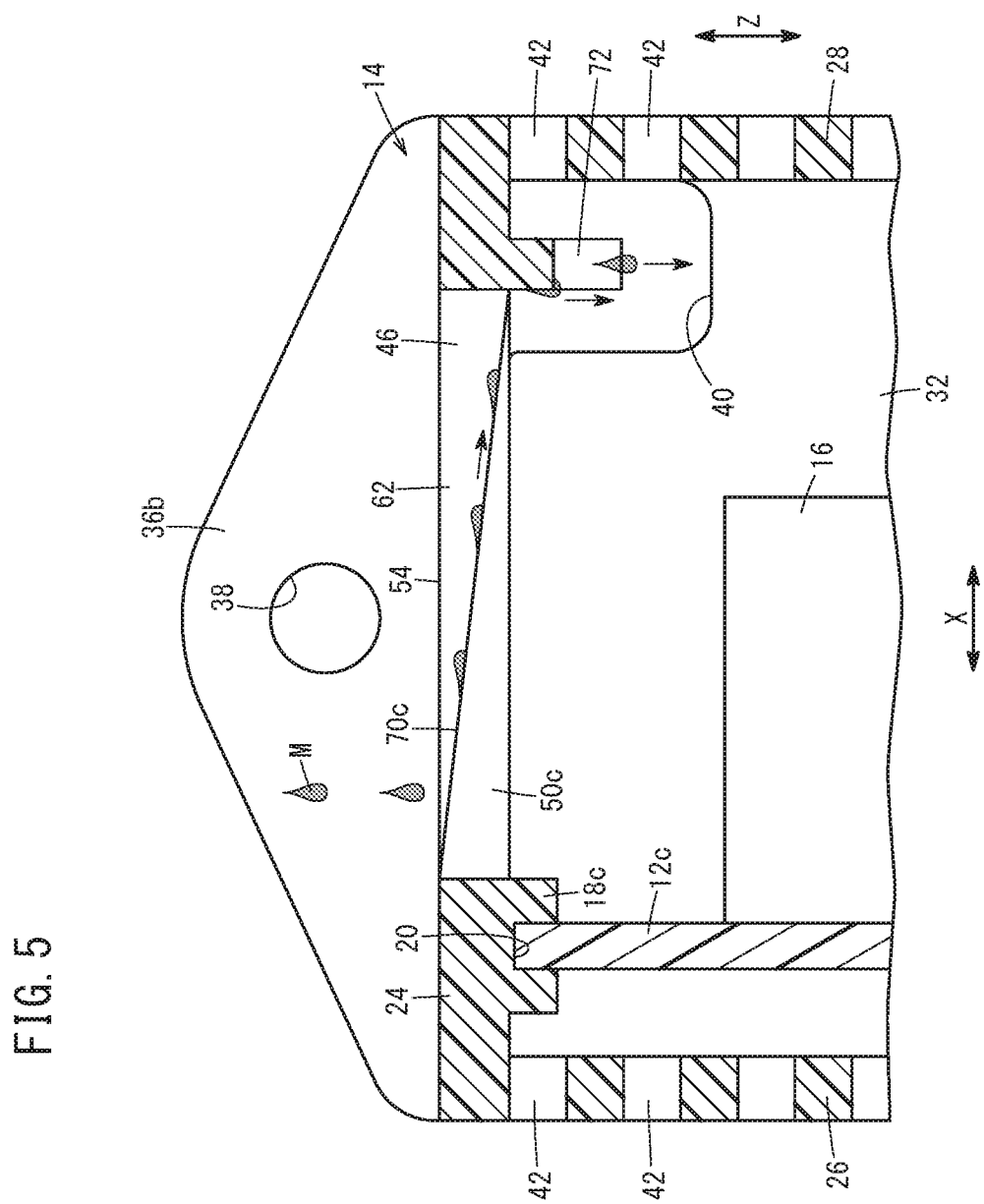
FIG. 5 shows a main part of a front longitudinal cross section of an electronic device according to a modification of the first example in which one substrate is housed in a casing.

The number of printed circuit boards housed in the casing 14 is not limited to two in particular. Only one printed circuit board 12c may be housed as in, for example, a modification shown in FIG. 5.

In this case, the printed circuit board 12c deviates toward the first side plate portion 26 side, and is positioned and fixed by the insertion grooves 20 of a lower support portion 17c (see FIG. 16) and an upper support portion 18c. Hence, a step portion 70c only needs to be formed on the second long side sidewall 62 (or the first long side sidewall 60) to incline to the lower side at a farther side from the first side plate portion 26 (printed circuit board 12c) and at a closer side to the second side plate portion 28. Of course, the inclined rib 72 and the drain hole 40 are formed deviating toward the second side plate portion 28 side.

Next, a second example will be described. Components that are the same as or correspond to the components shown in FIGS. 1 to 5 will be basically assigned the same reference numerals and will not be described in detail.

Figure 6:
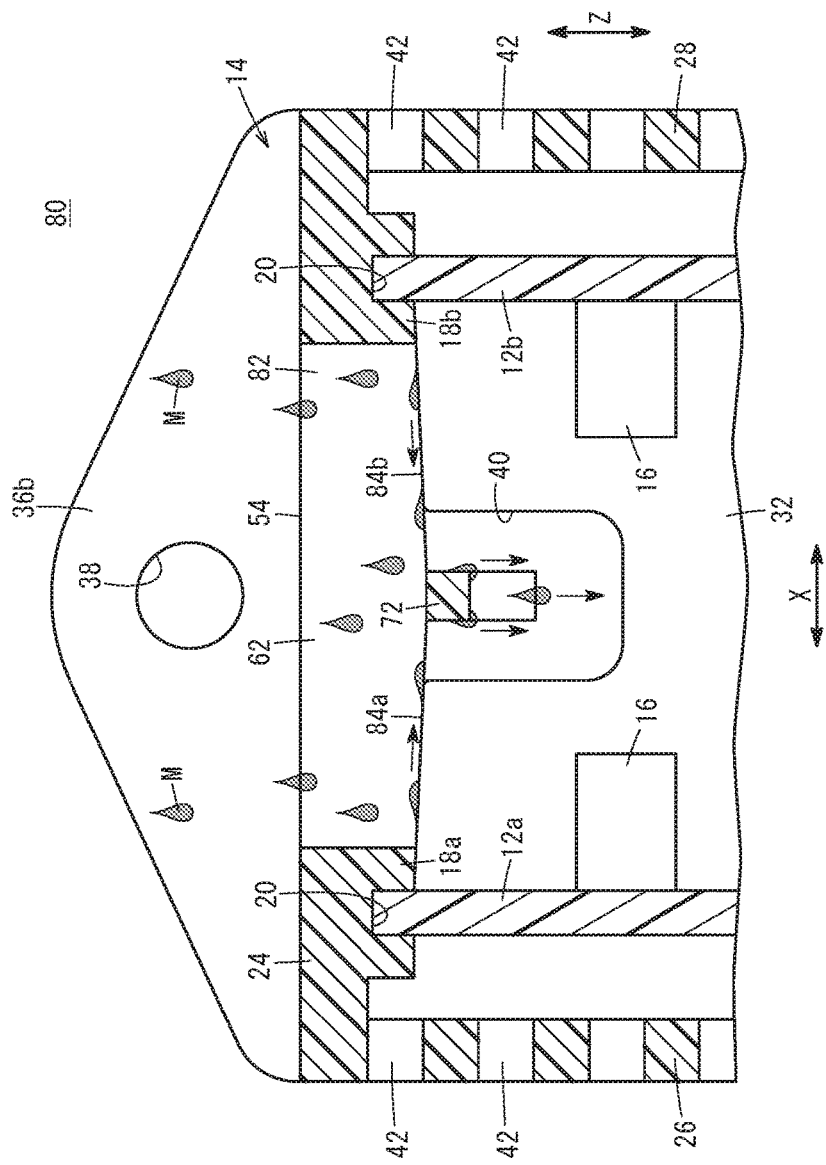
FIG. 6 shows a main part of a front longitudinal cross section of an electronic device according to a second example in which two substrates are housed in a casing.
Figure 7:
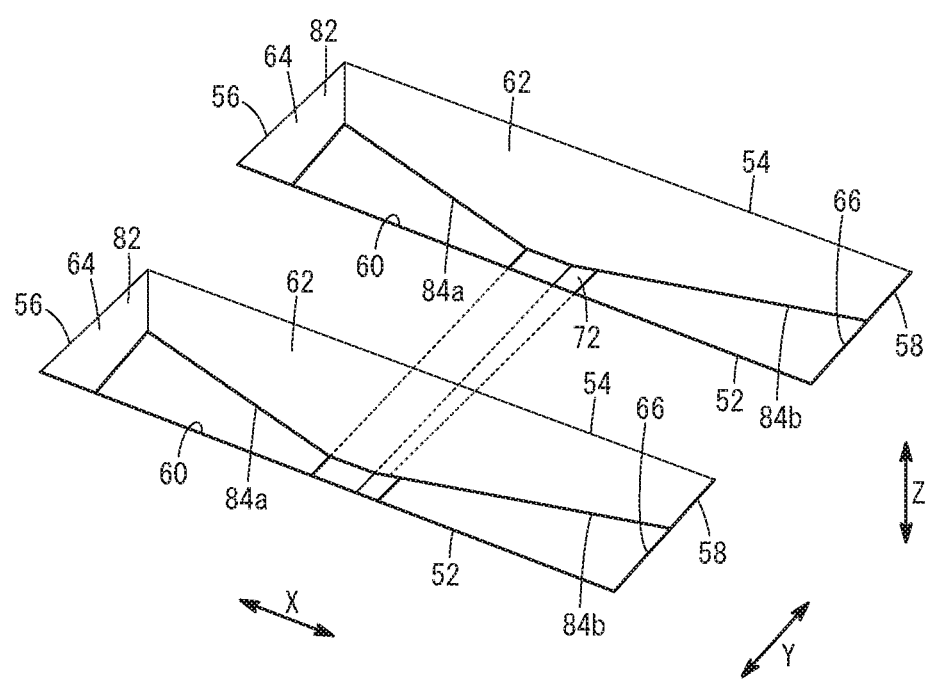
FIG. 7 is an enlarged perspective view showing a main part of a proximity of top panel dissipation slits of the electronic device shown in FIG. 6.

FIGS. 6 and 7 are a main part of a front longitudinal cross section of an electronic device 80 according to the second example, and an enlarged perspective view showing a main part of top panel heat dissipation slits 82, respectively. In the second example, two lower protrusion portions 84a, 84b that protrude in the depth direction of each top panel heat dissipation slit 82 are formed at lower ends of the first long side sidewall 60 and the second long side sidewall 62 of each top panel heat dissipation slit 82.

The lower protrusion portion 84a inclines to the lower side at a farther side from the first short side sidewall 64 and the printed circuit board 12a. The lower protrusion portion 84b inclines to the lower side at a farther side from the second short side sidewall 66 and the printed circuit board 12b. Lower end portions of the lower protrusion portions 84a, 84b face each other at a predetermined distance from each other.

The inclined rib 72 is formed in the casing 14 similar to the first example. The inclined rib 72 extends along the depth direction of the casing 14 (the extension direction of the printed circuit boards 12a, 12b) and crosses the substantially intermediate portions of the first long side 52 and the second long side 54 of all top panel heat dissipation slits 82. The inclined rib 72 continues to lower end portions of the lower protrusion portions 84a, 84b of each top panel heat dissipation slit 82.

The other components conform to those of the first example. That is, the inclined rib 72 inclines from the upper side to the lower side toward the depth direction of the casing 14. Therefore, the lower end portion of the inclined rib 72 faces the rear plate 32 side of the casing 14. The drain hole 40 is formed at the position of the rear plate 32 of the casing 14 facing the lower end portion.

When the mists M such as a cutting fluid enter the top panel heat dissipation slits 82 in the electronic device 80 according to the second example formed in this way, the mists M go lower while being guided by the lower protrusion portions 84a, 84b formed on the first long side sidewall 60 and the second long side sidewall 62, and move to the intermediate portions of the first long side 52 and the second long side 54.

The subsequent points are the same as those in the first example. That is, the mists M move onto the inclined rib 72 that locate near the lower end portions of the lower protrusion portions 84a, 84b, then go lower along the lower end surface of the inclined rib 72, and are led outside the casing 14 via the drain hole 40 formed in the rear plate 32 of the casing 14.

Of course it is possible to increase the effective volume in the casing 14 in the second example, too. Further, it is possible to reduce the use amount of the resin material that is the material of the casing 14, and reduce the weight of the casing 14. Consequently, in the second example as well, it is possible to provide the same effect as that of the first embodiment.

In the second example as well, the number of printed circuit boards housed in the casing 14 is not limited to two in particular. That is, only one printed circuit board 12c may be housed as in a modification shown in FIG. 8.

Figure 8:
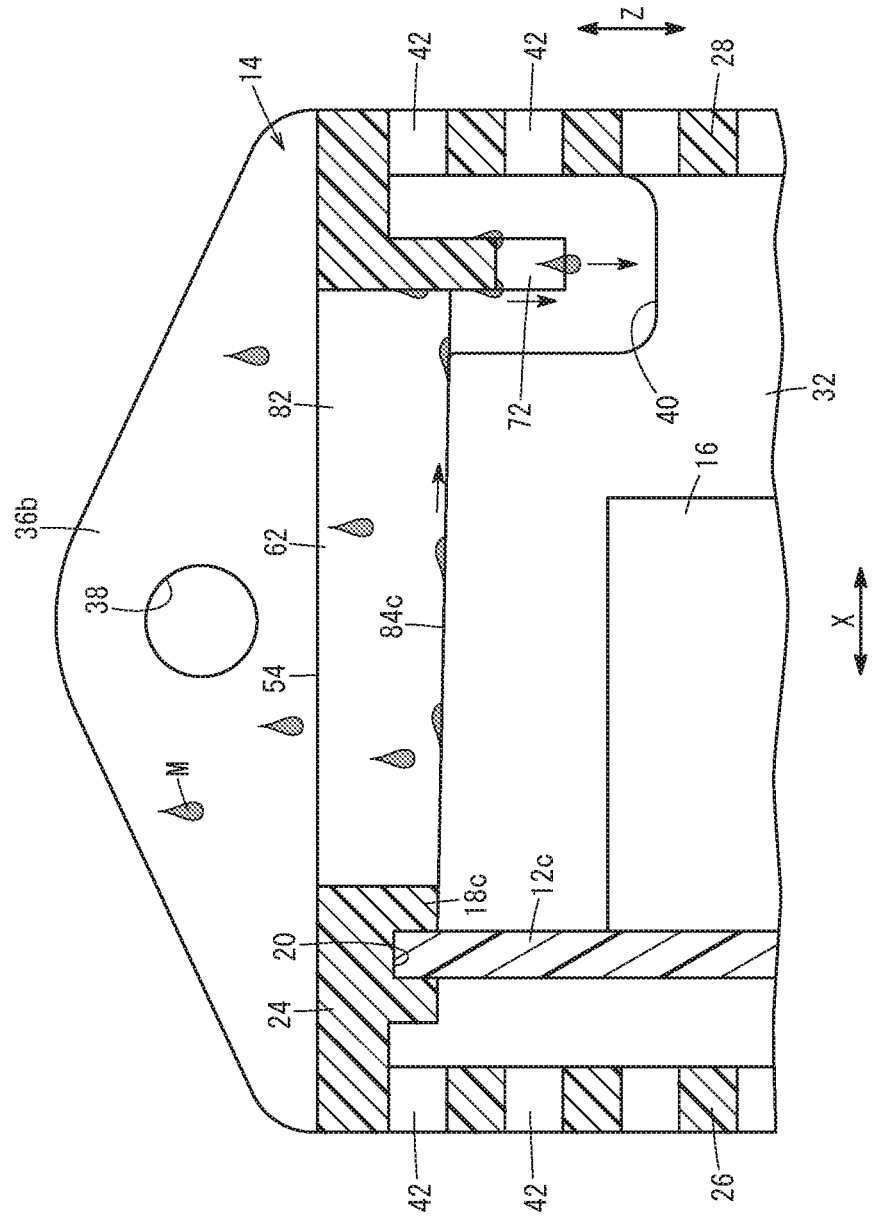
FIG. 8 shows a main part of a front longitudinal cross section of an electronic device according to a modification of the second example in which one substrate is housed in a casing.

FIG. 8 shows a case where one printed circuit board 12c deviates toward the first side plate portion 26 side and is positioned and fixed by the upper support portion 18c. In this case, a lower protrusion portion 84c only needs to be formed on the second long side sidewall 62 (or the first long side sidewall 60) to incline to the lower side as the lower protrusion portion 84c extends away from the first side plate portion 26 (printed circuit board 12c) toward the second side plate portion 28. The inclined rib 72 and the drain hole 40 are formed so as to deviate toward the second side plate portion 28 side.

Figure 9:
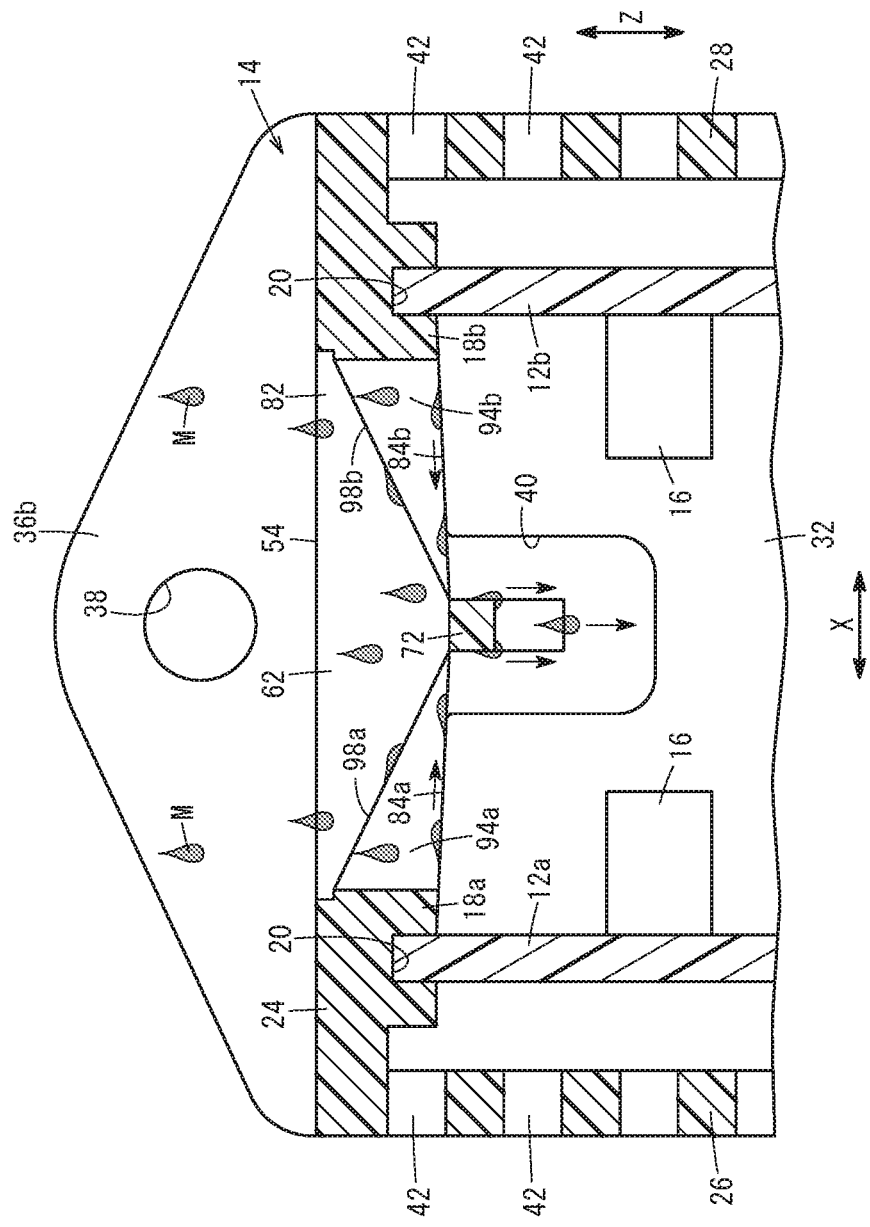
FIG. 9 shows a main part of a front longitudinal cross section of the electronic device according to the modification of the second example in which two substrates are housed in the casing and step portions are formed on a lower protrusion portion.
Figure 10:
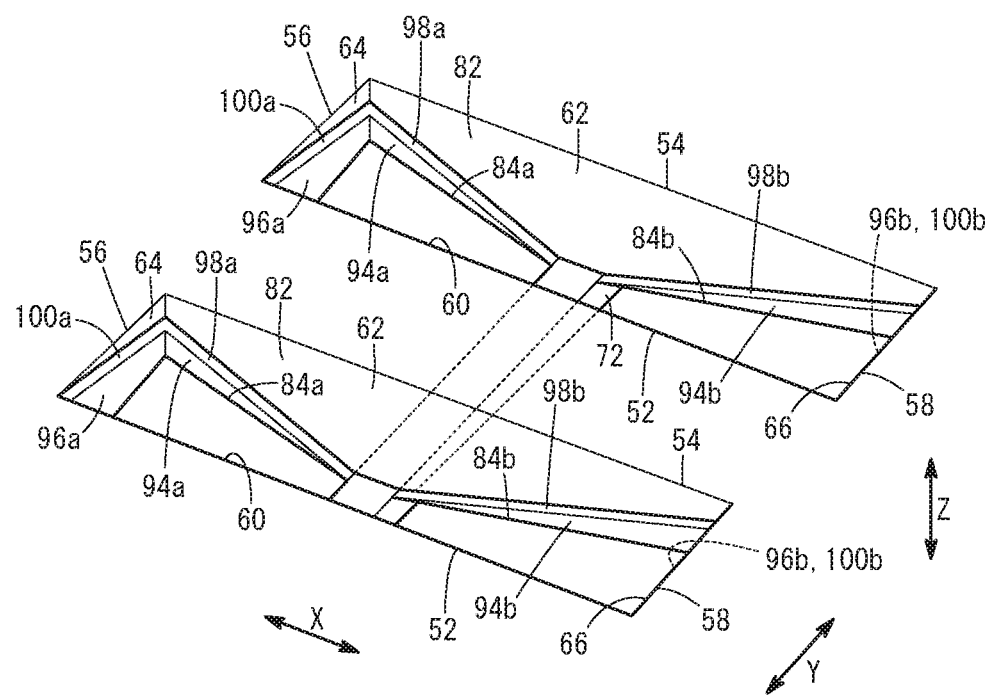
FIG. 10 is an enlarged perspective view showing a main part of a proximity of top panel heat dissipation slits of the electronic device shown FIG. 9.

Step portions may be formed on the lower protrusion portions 84a, 84b. This modification will be described with reference to FIGS. 9 and 10. FIGS. 9 and 10 show that long side projection portions 94a, 94b (long side protrusion portions) are formed on the lower protrusion portions 84a, 84b, and short side projection portions 96a, 96b (short side protrusion portions) are formed on the first short side sidewall 64 and the second short side sidewall 66.

More specifically, the long side projection portions 94a, 94b are formed protruding from a proximity of intermediate portions of the lower protrusion portions 84a, 84b in the height direction toward the first long side sidewall 60. Hence, the lower protrusion portions 84a, 84b and the long side projection portions 94a, 94b form long side step portions 98a, 98b (long side step portions). Upper end portions of the long side projection portions 94a, 94b are near an intermediate portion of the second long side sidewall 62 in the height direction. Lower end portions face each other at a predetermined distance from each other.

The short side projection portion 96a is formed protruding from the first short side sidewall 64 toward the second short side sidewall 66. Hence, the first short side sidewall 64 and the short side projection portions 96a form a short side step portion 100a (short site step portion). The short side projection portion 96a inclines continuing to an opening side of the first long side sidewall 60 and the upper end portion of the long side projection portion 94a. Hence, an upper end portion of the short side step portion 100a is near the opening of the first long side sidewall 60, and a lower end portion continues to an upper end portion of the long side step portion 98a.

The short side projection portion 96b protrudes from the second short side sidewall 66 toward the first short side sidewall 64. The second short side sidewall 66 and the short side projection portion 96b form a short side step portion 100b (short side step portion). The short side projection portion 96b continues to the opening side of the first long side sidewall 60 and the upper end portion of the long side projection portion 94b. That is, the short side step portion 100b inclines such that an upper end portion continues to the proximity of the opening of the first long side sidewall 60 and that the lower end portion continues to an upper end portion of the long side step portion 98b.

According to this configuration, when the mist M adheres to the proximity of the first short side 56 (second short side 58) and enters the top panel heat dissipation slit 82, the mist M is guided by the short side step portion 100a (short side step portion 100b) and reaches the long side step portion 98a (long side step portion 98b). The mist M further goes lower while being guided by the long side step portion 98a (long side step portion 98b), and moves onto the inclined rib 72. Subsequently, the mist M moves along the lower end surface of the inclined rib 72 similar to the above, and is led outside the casing 14 from the drain hole 40.

Only the long side projection portions 94a, 94b may be formed.

Figure 11:
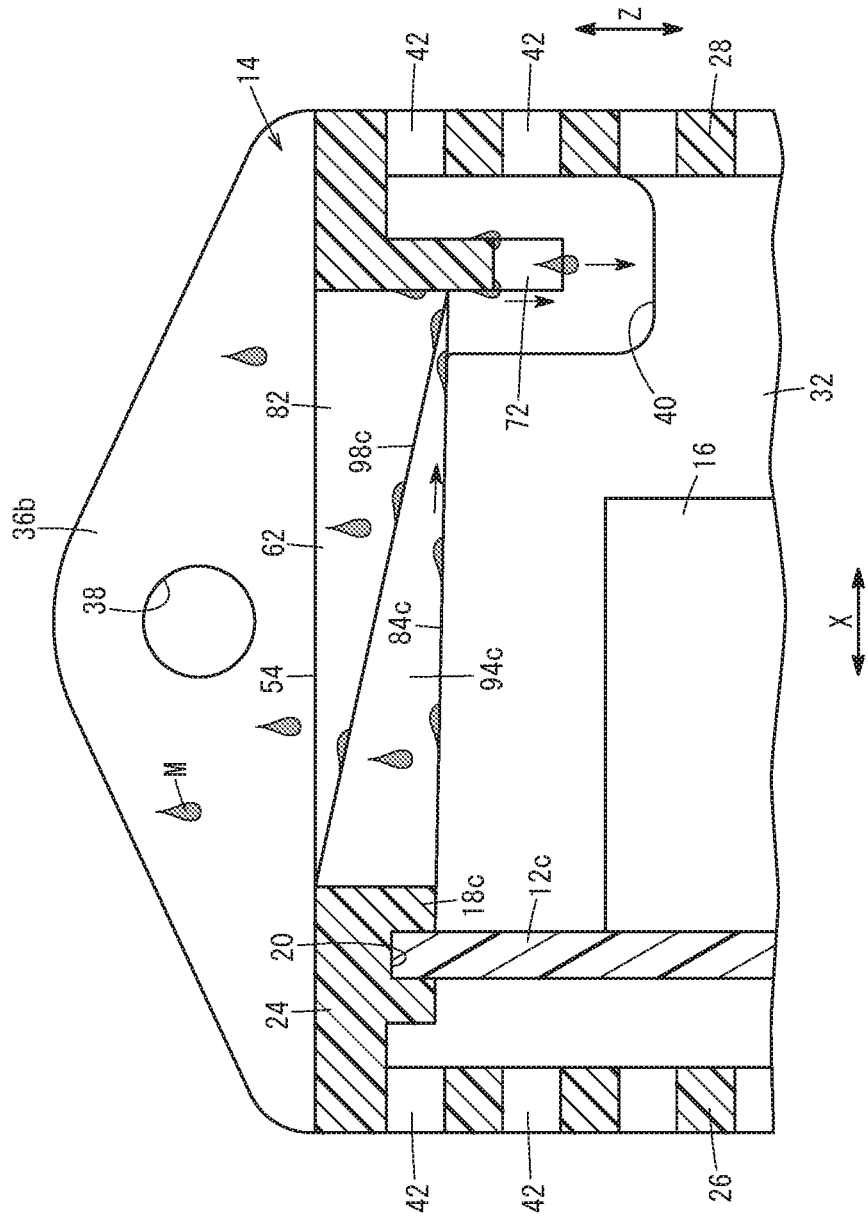
FIG. 11 shows a main part of a front longitudinal cross section of the electronic device according to the modification of the second example in which one substrate is housed in the casing and the step portions are formed on the lower protrusion portion.

As shown in FIG. 11, even when only one printed circuit board 12c is housed in the casing 14, it is possible to form a long side step portion 98c by forming a long side projection portion 94c on a lower protrusion portion 84c that is formed on the second long side sidewall 62 and protrudes toward the depth direction of each top panel heat dissipation slit 82.

Figure 12:
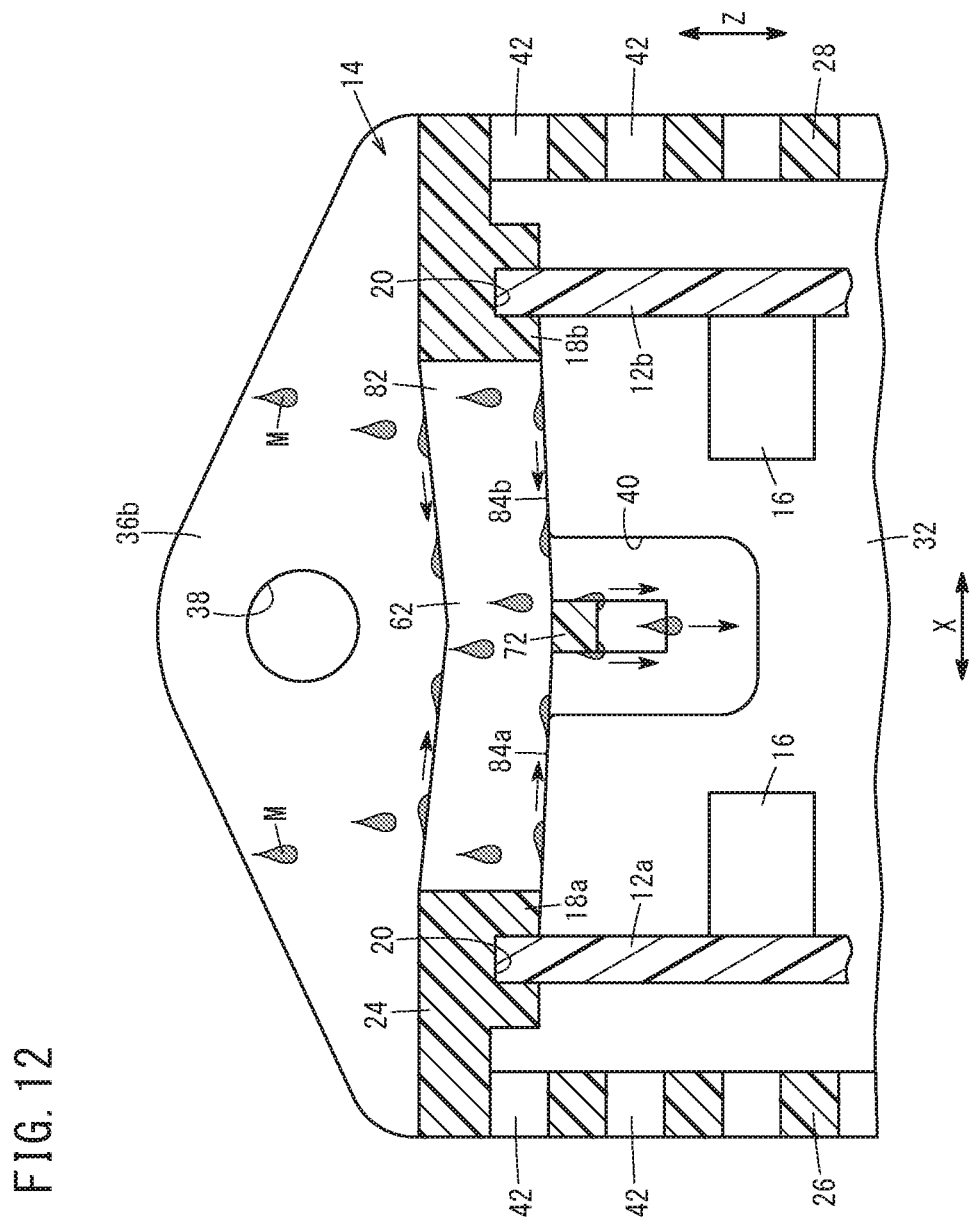
FIG. 12 shows a main part of a front longitudinal cross section of the electronic device according to the modification of the second example in which two substrates are housed in the casing and an inclination is formed in a top panel.

As shown in FIG. 12, the top panel portion 24 may incline to the lower side toward the lower projection portions 84a, 84b. According to this configuration, when the mist M adheres to a portion of the top panel portion 24 other than portions at which the top panel heat dissipation slits 82 are formed, the mist M is guided to each top panel heat dissipation slit 82 by the inclined top panel portion 24. Subsequently, similar to the above, the mist M moves onto the inclined rib 72 via the lower protrusion portions 84a, 84b, then moves along the lower end surface of the inclined rib 72 and is led outside the casing 14 through the drain hole 40.

Thus, by forming an inclination in the top panel portion 24, it is easy to discharge the mist M adhered to the top panel portion 24, to the outside of the casing 14.

Figure 13:
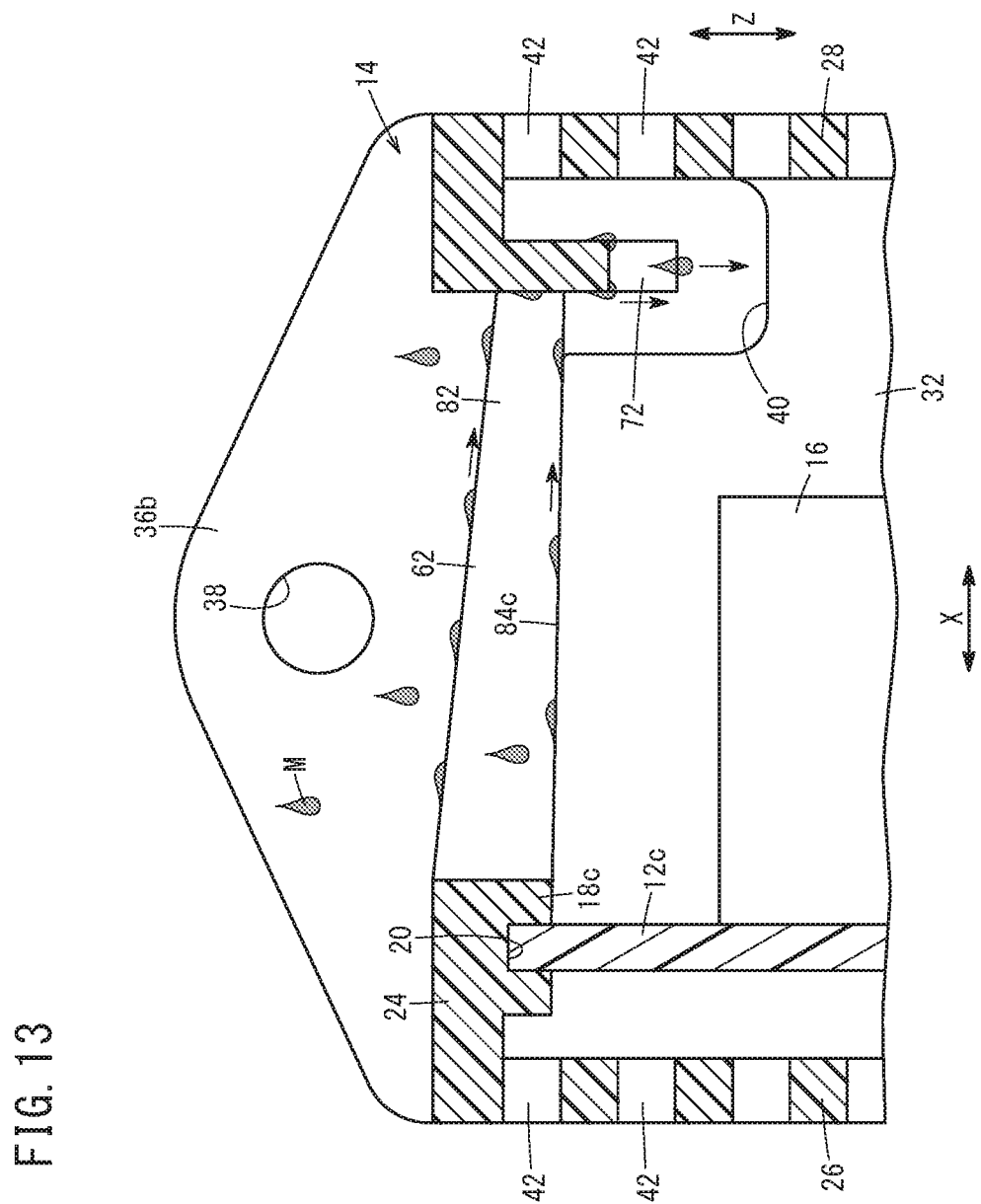
FIG. 13 shows a main part of a front longitudinal cross section of the electronic device according to the modification of the second example in which one substrate is housed in the casing and an inclination is formed in the top panel.

As shown in FIG. 13, even when only one printed circuit board 12c is housed in the casing 14, it is possible to incline the top panel portion 24 to the lower side toward the lower protrusion portion 84c. FIG. 13 shows a case where one printed circuit board 12c deviates toward the first side plate portion 26 side and is positioned and fixed by the upper support portion 18c similar to FIG. 11. The lower protrusion portion 84c is formed on the second long side sidewall 62 (or first long side sidewall 60) to incline to the lower side at a farther side from the first side plate portion 26 (printed circuit board 12c) and at a side closer to the second side plate portion 28. The inclined rib 72 and the drain hole 40 deviate toward the second side plate portion 28 side.

Figure 14:
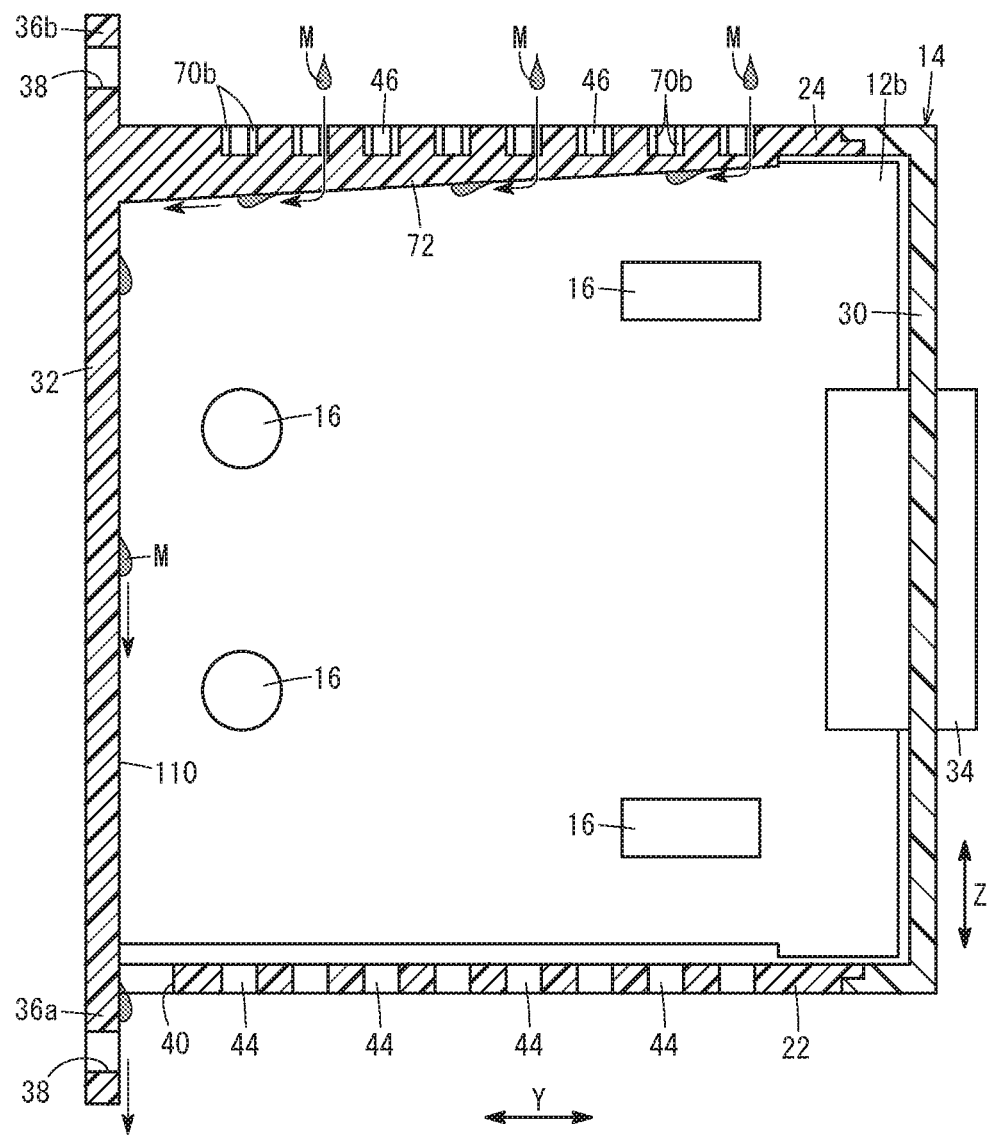
FIG. 14 is a side longitudinal cross-sectional view of an electronic device in which two substrates are housed in a casing and that includes a longitudinal rib continuing to an inclined rib.
Figure 15:
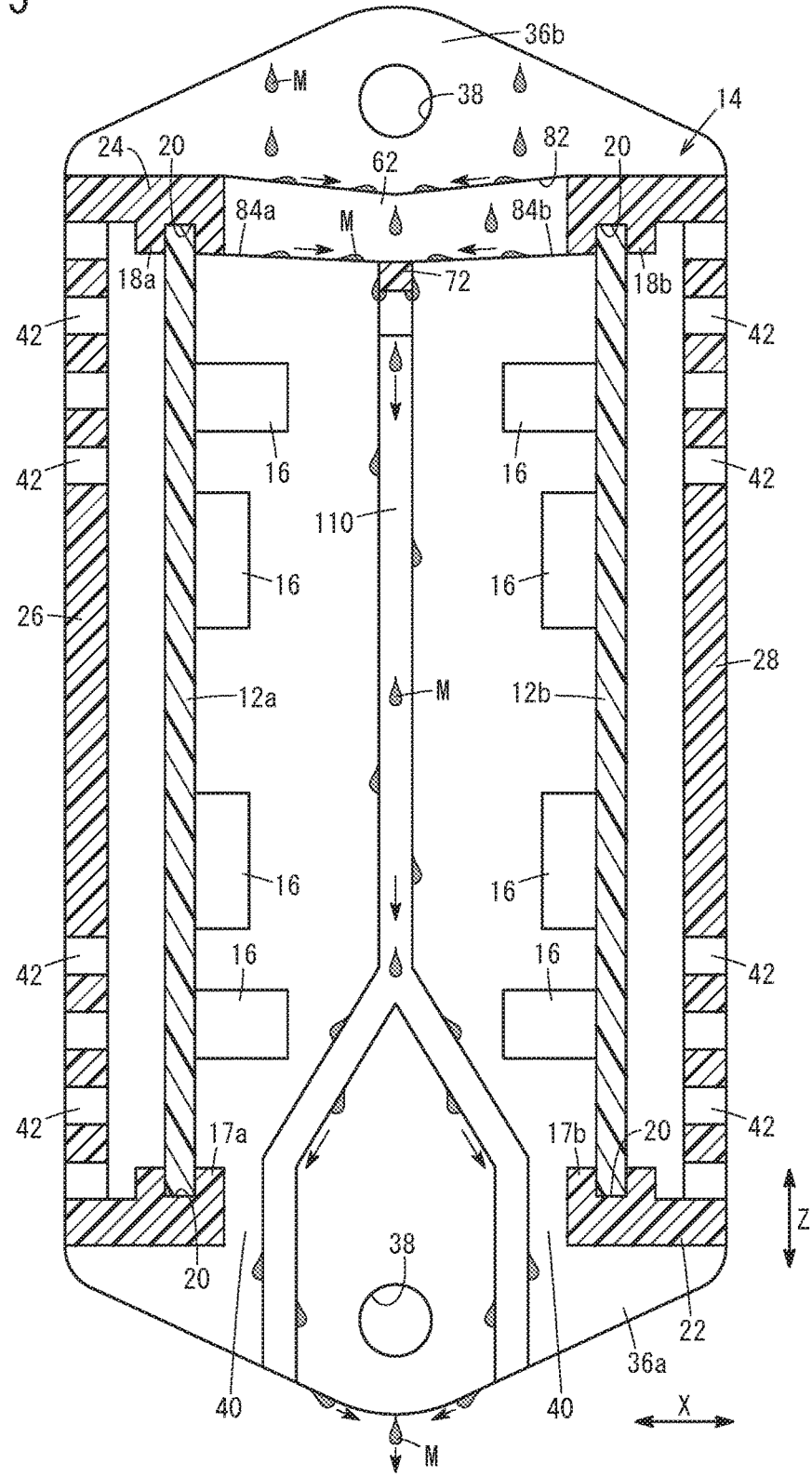
FIG. 15 is a front longitudinal cross-sectional view of the electronic device in which two substrates are housed in the casing and that includes the longitudinal rib continuing to the inclined rib.
Figure 16:
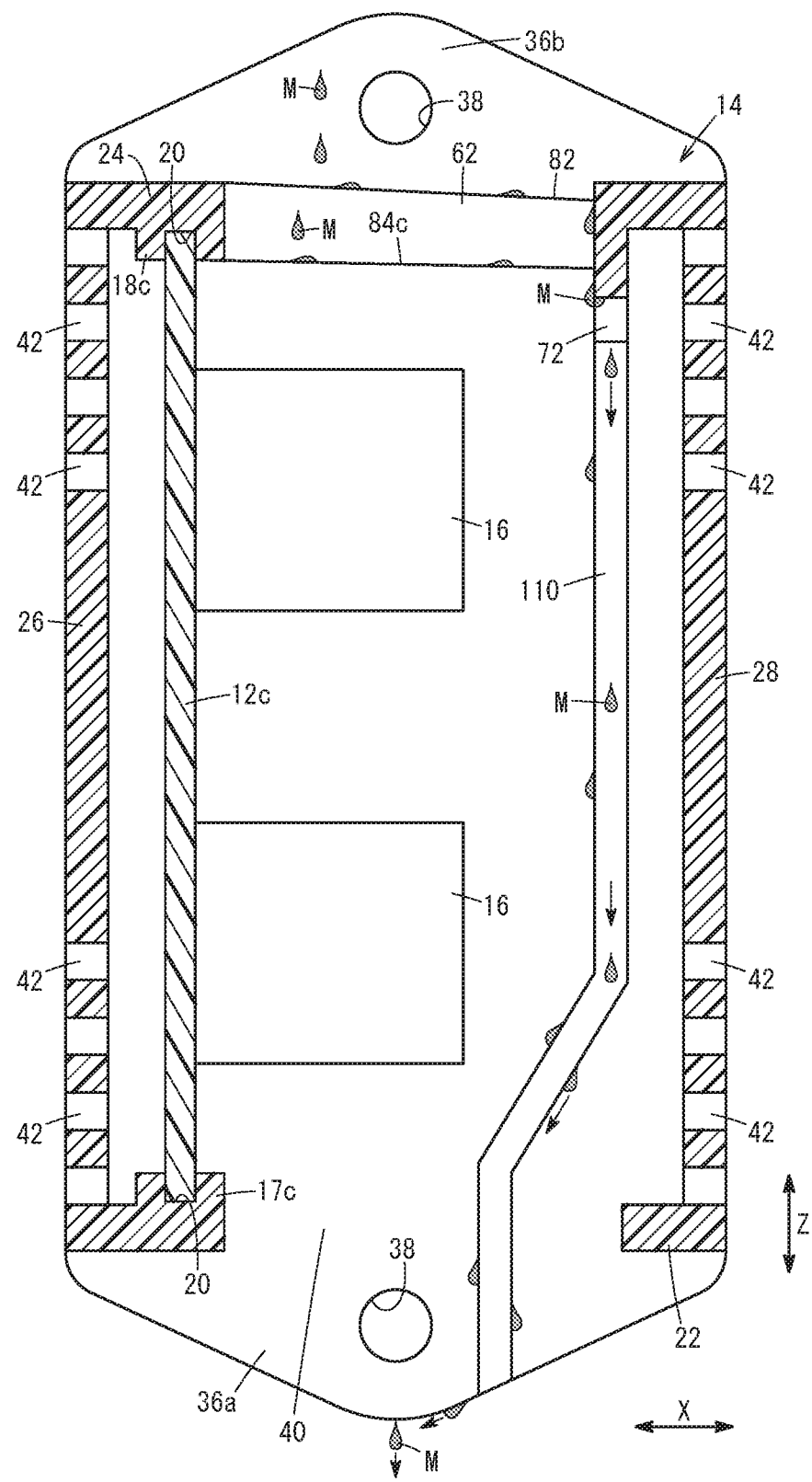
FIG. 16 is a front longitudinal cross-sectional view of the electronic device in which one substrate is housed in the casing and that includes the longitudinal rib continuing to the inclined rib.

In both of the first example and the second example, a longitudinal rib 110 may be formed as shown in FIGS. 14 to 16. FIGS. 14 and 15 show examples where the number of housed printed circuit boards is two that are the printed circuit boards 12a, 12b. FIG. 16 shows an example where the number of housed printed circuit boards is one that is the printed circuit board 12c.

The longitudinal rib 110 only needs to have a shape formed by bending the lower end portion of the inclined rib 72 in a vertically downward direction. In other words, the longitudinal rib 110 is formed continuing to the inclined rib 72 such that a traveling direction of the inclined rib 72 is changed from an inclination direction with respect to the vertical direction to the vertically downward direction. As shown in FIG. 15, the longitudinal rib 110 may be branched.

A lower end portion of the longitudinal rib 110 faces the bottom plate portion 22 of the casing 14. In this case, the drain hole 40 is formed in the bottom plate portion 22 of the casing 14.

According to this configuration, the mists M having entered the top panel heat dissipation slits 46 (82) move along the inclined rib 72 toward the rear plate 32 side of the casing 14. Subsequently, the mists M move from the inclined rib 72 onto the longitudinal rib 110, so that a movement direction of the mists M is changed to the bottom plate portion 22 side. That is, the mists M go lower toward the bottom plate portion 22 side while being guided by the longitudinal rib 110, and are finally led outside the casing 14 via the drain hole 40.

The mists M discharged from the drain hole 40 drop in the vertically downward direction under a gravitational action. Consequently, it is possible to avoid adherence of the mists M to a bottom surface of the bottom plate portion 22. That is, in this case, it is possible to prevent an outer surface of the casing 14 from becoming dirty with the mists M. Consequently, it is possible to keep the electronic device 10 clean.

In the first example and the second example, the mists M of a cutting fluid have been described as an example. However, droplets are not limited to this in particular. For example, it is possible to discharge droplets due to condensation as well, to the outside of the casing 14 similar to the above.

The present invention is not limited to the above embodiments in particular, and can be variously modified without departing from the scope of the present invention.

In, for example, the first example as well, the top panel portion 24 may incline similar to the second example.

The top panel heat dissipation slits 46, 82 may have so-called elongated hole shapes.

Three or more printed circuit boards may be housed in the casing 14. In this case, it is only necessary to increase the numbers of step portions and lower protrusion portions, and increase the number of the inclined ribs 72 that cross each of the top panel heat dissipation slits 46, 82.

What is claimed is:

1. An electronic device that is formed by housing one or more substrates in a casing, the one or more substrates being provided with an electronic part, and the casing including a plurality of heat dissipation slits formed in a top panel, wherein:
   the heat dissipation slits each have an elongated shape including a first short side and a second short side that extend in substantially parallel to an extension direction of the substrates, and a first long side and a second long side that extend in a direction substantially orthogonal to the extension direction and face each other, and include a first short sidewall, a second short sidewall, a first long sidewall and a second long sidewall that extend along a depth direction of the first short side, the second short side, the first long side and the second long side;
   a projection portion is formed on at least one of the first long sidewall and the second long sidewall that face each other, and protrudes toward another of the first long sidewall and the second long sidewall, and the projection portion forms a step portion with the one of the first long sidewall and the second long sidewall;
   the step portion slants away from the substrates as the step portion extends away from the substrates;
   an inclined rib is formed in the casing near an end of the step portion closest to the projection portion and extend along the extension direction of the substrates so as to cross all of the heat dissipation slits;
   the inclined rib increases in thickness along the extension direction, in a thickness direction orthogonal to the extension direction; and
   a drain hole configured to discharge a droplet guided by the inclined rib is formed in a wall surface of the casing.

2. The electronic device according to claim 1, wherein the drain hole is formed at a position of the casing at the thickest end of the inclined rib.

3. The electronic device according to claim 1, further comprising:
   a longitudinal rib in communication with the inclined rib and extending in a direction substantially orthogonal to the inclined rib,
   wherein the drain hole is in communication with an end of the longitudinal rib farthest from the inclined rib and formed at a position of a bottom plate of the casing.

4. The electronic device according to claim 1, wherein the top panel slants toward the step portion as the top panel extends toward the step portion.

5. An electronic device that is formed by housing one or more substrates in a casing, the one or more substrates being provided with an electronic part, and the casing including a plurality of heat dissipation slits formed in a top panel, wherein:
   the heat dissipation slits each have an elongated shape including a first short side and a second short side that extend in substantially parallel to an extension direction of the substrates, and a first long side and a second long side that extend in a direction substantially orthogonal to the extension direction and face each other, and include a first short sidewall, a second short sidewall, a first long sidewall and a second long sidewall that extend along a depth direction of the first short side, the second short side, the first long side and the second long side;
   a first end of at least one of the first long sidewall and the second long sidewall protrudes in a depth direction of the heat dissipation slits to form a first protrusion portion;
   the first protrusion portion slants away from the substrates as the first protrusion portion extends away from the substrates;
   an inclined rib is formed in the casing near a second end portion of the first protrusion portion and extends along the extension direction of the substrates so as to cross all of the heat dissipation slits;
   the inclined rib slants toward the extension direction; and
   a drain hole configured to discharge a droplet guided by the inclined rib is formed in a wall surface of the casing.

6. The electronic device according to claim 5, wherein the drain hole is formed in the casing facing a distal end portion of the inclined rib.

7. The electronic device according to claim 5, further comprising:
   a longitudinal rib in communication with the inclined rib and extending in a direction substantially orthogonal to the inclined rib,
   wherein the drain hole is in communication with an end of the longitudinal rib farthest from the inclined rib and formed at a position of a bottom plate of the casing.

8. The electronic device according to claim 5, wherein:
   a long side projection portion is formed on the first protrusion portion, and protrudes toward the first long sidewall or the second long sidewall facing the first protrusion portion, and the long side projection portion forms a long side step portion with the long side sidewall; and
   the long side step portion slants away from the substrates.

9. The electronic device according to claim 8, wherein:
   a short side projection portion is formed on one of the first short sidewall and the second short sidewall that face each other, and protrudes toward another of the first short sidewall and the second short sidewall, and the short side projection portion forms a short side step portion with the one of the first short sidewall and the second short sidewall; and
   the short side step portion slants toward a first end portion of the long side step portion, and a second end portion of the short side step portion continues to the first end portion of the long side step portion.

10. The electronic device according to claim 5, wherein the top panel slants toward the first protrusion portion.

* * * * *